(12) United States Patent
Fushimi et al.

(10) Patent No.: US 8,487,394 B2
(45) Date of Patent: Jul. 16, 2013

(54) SOLID-STATE IMAGING DEVICE AND METHOD OF MANUFACTURING THE SAME

(75) Inventors: Takeshi Fushimi, Iwate (JP); Takashi Takahashi, Kanagawa (JP); Junichi Ide, Saitama (JP); Yasushi Itabashi, Tokyo (JP); Koji Yoshikawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 272 days.

(21) Appl. No.: 12/881,631

(22) Filed: Sep. 14, 2010

(65) Prior Publication Data

US 2011/0096214 A1 Apr. 28, 2011

(30) Foreign Application Priority Data

Oct. 27, 2009 (JP) ................................. 2009-246537
Oct. 28, 2009 (JP) ................................. 2009-247893

(51) Int. Cl.
*H01L 31/0232* (2006.01)
(52) U.S. Cl.
USPC .................................. 257/436; 257/E31.117
(58) Field of Classification Search
USPC .......................................... 257/436, E31.117
See application file for complete search history.

(56) References Cited

U.S. PATENT DOCUMENTS

| | | | | |
|---|---|---|---|---|
| 5,238,856 A | * | 8/1993 | Tokumitsu | 438/69 |
| 5,536,455 A | * | 7/1996 | Aoyama et al. | 264/1.7 |
| 6,333,205 B1 | * | 12/2001 | Rhodes | 438/69 |
| 6,734,031 B2 | * | 5/2004 | Shizukuishi | 438/22 |
| 6,953,925 B2 | * | 10/2005 | Fang et al. | 250/214.1 |
| 7,029,944 B1 | * | 4/2006 | Conley et al. | 438/69 |
| 2004/0080005 A1 | * | 4/2004 | Yamamoto | 257/432 |

FOREIGN PATENT DOCUMENTS

| | | |
|---|---|---|
| JP | 6-125068 | 5/1994 |
| JP | 6-260625 | 9/1994 |
| JP | 2004-47682 | 2/2004 |
| JP | 2007-180541 | 7/2007 |
| JP | 2009-200297 | 9/2009 |

OTHER PUBLICATIONS

U.S. Appl. No. 13/234,407, filed Sep. 16, 2011, Ito et al.
Office Action mailed Apr. 23, 2013 in Japanese Application No. 2009-247893 filed Oct. 28, 2009 (w/English translation).

* cited by examiner

*Primary Examiner* — Lex Malsawma
(74) *Attorney, Agent, or Firm* — Oblon, Spivak, McClelland, Maier & Neustadt, L.L.P.

(57) ABSTRACT

According to one embodiment, a solid-state imaging device includes a photoelectric conversion element, a light blocking section, and a protective layer. The protective layer protects the photoelectric conversion element and the light blocking section. A step section is formed on a surface of the protective layer. The step section is formed having a difference in height in a direction perpendicular to an irradiation surface of the photoelectric conversion element. The step section is provided in the light receiving area.

20 Claims, 14 Drawing Sheets

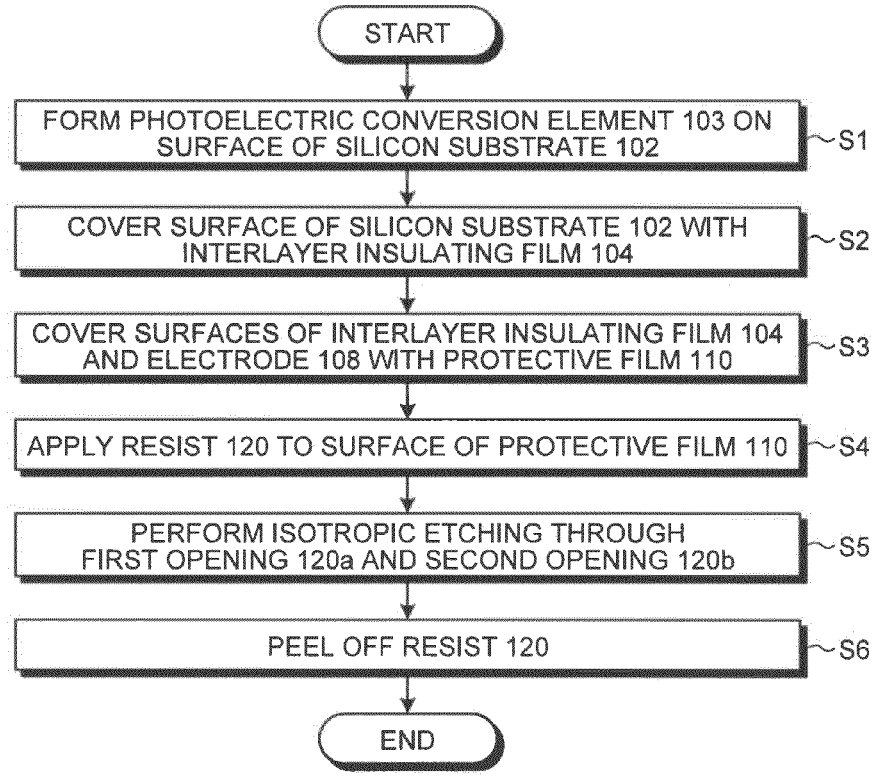
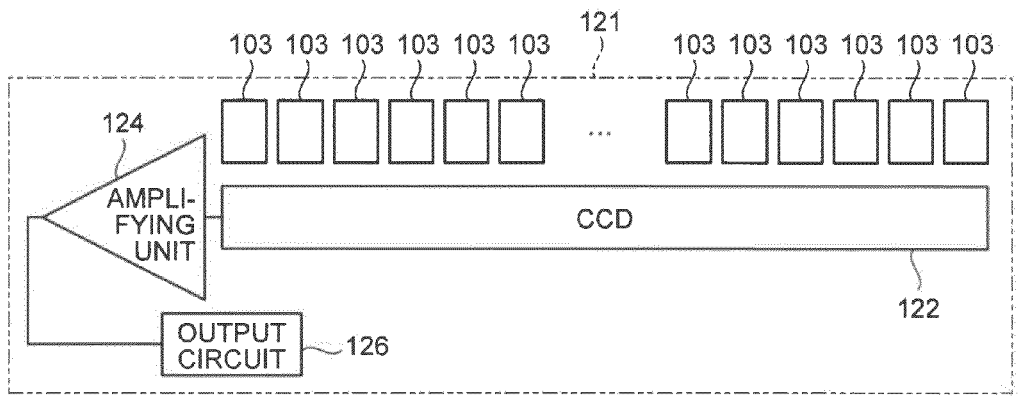

SOLID-STATE IMAGING DEVICE AND METHOD OF MANUFACTURING THE SAME

CROSS-REFERENCE TO RELATED APPLICATIONS

This application is based upon and claims the benefit of priority from the prior Japanese Patent Application No. 2009-246537, filed on Oct. 27, 2009; and No. 2009-247893, filed on Oct. 28, 2009; the entire contents of all of which are incorporated herein by reference.

FIELD

Embodiments described herein relate generally to a solid-state imaging device and a method of manufacturing the same.

BACKGROUND

In recent years, solid-state imaging devices (image sensors) that photograph subject images are widely used in cameras, cellular phones, and the like. Among the solid-state imaging devices, some solid-state imaging device is configured by covering the surface of a silicon substrate, on which pixels that perform photoelectric conversion are formed, with an interlayer insulating film (a protective layer) of $SiO_2$ or the like.

As one kind of performance of the solid-state imaging devices, in some case, a spectral characteristic as a sensitivity characteristic of each of wavelengths of incident light poses a problem. When a relation between the wavelength of the incident light and a light response output is represented, it is ideal that fluctuation in the light output response is gentle with respect to a change in the wavelength. On the other hand, in some case, the relation indicates a spectral characteristic in which the light response output fluctuates in a wavy manner with respect to a change in the wavelength. As a cause of the spectral characteristic, there is interference between light directly made incident on a photoelectric conversion element and light reflected on an interface of a protective layer provided on a semiconductor substrate. It is considered effective to suppress the interference of light to reduce such fluctuation in the spectral characteristic.

In general, in a solid-state imaging device, a pattern made of aluminum (hereinafter referred to as "aluminum wire" as appropriate) is provided as a light blocking section for reducing leakage of light to pixels adjacent to one another. Depending on a mode of forming an uneven shape on the surface of a protective layer, a satisfactory spectral characteristic is obtained. On the other hand, in some case, the aluminum wire formed in the inside of the protective layer tends to be exposed to the outside. The exposure of the aluminum wire to the outside leads to a fall in reliability of the solid-state imaging device because of corrosion or the like of the aluminum wire.

In the related art, a base layer pattern is formed on the interlayer insulating film, the base layer pattern is etched, and the base layer pattern is covered with an upper layer film by the CVD method to form a difference in height on a light incident surface of the solid-state imaging device. A pad electrode disposed on the interlayer insulating film is also covered with the base layer pattern and the upper layer film. Therefore, in addition to the steps, a step of etching the base layer pattern and the upper layer film is separately necessary to expose the pad electrode. Therefore, in the related art, in a manufacturing process for the solid-state imaging device, the number of steps increases to suppress the interference of light and it is difficult to hold down manufacturing cost.

BRIEF DESCRIPTION OF THE DRAWINGS

FIG. 20 is a flowchart for explaining the manufacturing process for the solid-state imaging device; and FIG. 21 is a block diagram of a schematic configuration of a CCD image sensor as an example of a solid-state imaging device.

DETAILED DESCRIPTION

In general, according to one embodiment, a solid-state imaging device includes a photoelectric conversion element, a light blocking section, and a protective layer. The photoelectric conversion element is provided in a light receiving area of a semiconductor substrate. The photoelectric conversion element generates charges corresponding to an incident light amount. The light blocking section is formed around the light receiving area. The light blocking section blocks light. The protective layer is provided on the semiconductor substrate. The protective layer protects the photoelectric conversion element and the light blocking section. A step section is formed on a surface of the protective layer on the opposite side of the semiconductor substrate side. The step section is formed having a difference in height in a direction perpendicular to an irradiation surface of the photoelectric conversion element. The step section is provided in the light receiving area.

Exemplary embodiments of a solid-state imaging device and a method of manufacturing the same will be explained below in detail with reference to the accompanying drawings. The present invention is not limited to the following embodiments.

Figure 1A:
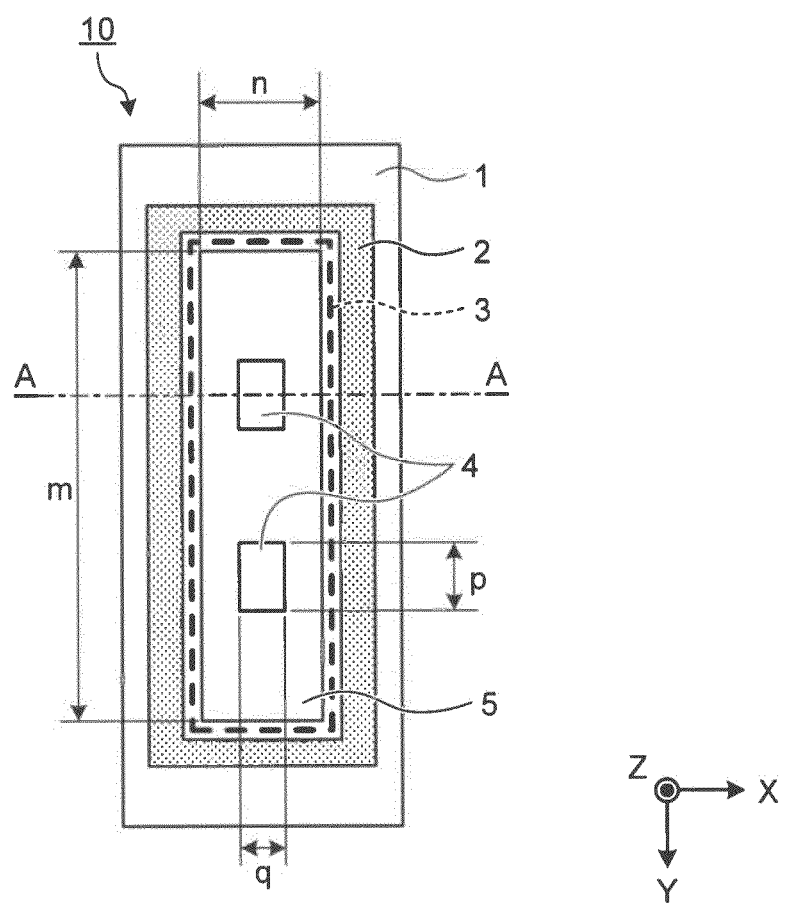
FIGS. 1A and 1B are schematic diagrams of the configuration of a solid-state imaging device according to a first embodiment.
Figure 1B:
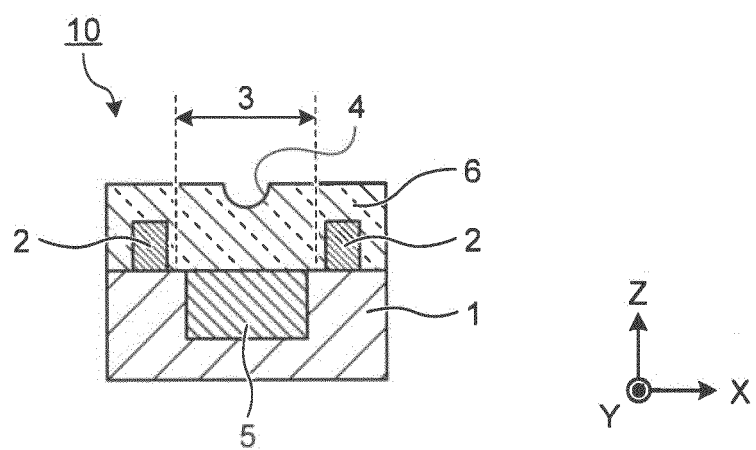

FIGS. 1A and 1B are schematic diagrams of the configuration of a solid-state imaging device 10 according to a first embodiment. The solid-state imaging device 10 is, for example, a CCD (Charge Coupled Device) area image sensor and includes a plurality of photoelectric conversion elements 5 arranged in parallel in the two-dimensional direction. FIG. 1A is a diagram of a plane configuration of one photoelectric conversion element 5 and a section around the photoelectric conversion element 5 in the solid-state imaging device 10. FIG. 1B is a diagram of a sectional configuration taken along line A-A shown in FIG. 1A. A plane parallel to an irradiation surface of the photoelectric conversion element 5 on which light is made incident is XY plane. An X direction and a Y direction are perpendicular to each other. A Z direction is a direction perpendicular to the XY plane. In the solid-state imaging device 10, the photoelectric conversion elements 5 are arranged in an array shape in the X and Y directions.

The photoelectric conversion element 5 includes a part of an impurity diffusion area formed on the surface of the semiconductor substrate 1. The photoelectric conversion element 5 generates charges corresponding to an incident light amount. An aluminum wire 2 is formed around the photoelectric conversion element 5 on the semiconductor substrate 1. The aluminum wire 2 functions as a blocking section that blocks light. A protective layer 6 provided on the semiconductor substrate 1 protects the photoelectric conversion element 5 and the aluminum wire 2. The protective layer 6 is formed of, for example, a silicon oxide film or a silicon nitride film.

A light receiving area 3 indicated by a broken line in the figure is an area surrounded and shielded from light by the aluminum wire 2 in an area on the semiconductor substrate 1. In the light receiving area 3, incident light can be effectively photoelectrically converted by the photoelectric conversion element 5. In the case of this embodiment, one light receiving area 3 generally coincides with an irradiation surface area of one photoelectric conversion element 5 and forms, for example, a pixel. In the plane configuration shown FIG. 1A, the light receiving area 3 and the photoelectric conversion element 5 are formed in a rectangular shape having the Y direction as a longitudinal direction. The aluminum wire 2 blocks light among a plurality of light receiving areas 3 to thereby reduce light leakage to pixels adjacent to one another. The aluminum wire 2 is not limited to an aluminum wire provided for the purpose of only light blocking and can also be an aluminum wire used for transfer of charges.

Step sections 4 are provided on a surface of the protective layer 6 on the opposite side of the semiconductor substrate 1 side. The step sections 4 are formed in a concave shape having a difference in height in the Z direction. The step sections 4 include spherical or aspherical curved surfaces having curvatures in the X direction (a first direction) and the Y direction (a second direction). The step sections 4 are formed by, for example, isotropic etching performed by using a resist pattern as a mask.

In the plane configuration shown in FIG. 1A, two step sections 4 are formed in one light receiving area 3. The two step sections 4 are arranged spaced apart from each other in the Y direction. The step sections 4 are located substantially in the center of the light receiving area 3 in the X direction and are located between the ends and the center of the light receiving area 3 in the Y direction. In the light receiving area 3, the step sections 4 are arranged further on the center position side than a boundary between the light receiving area 3 and the aluminum wire 2.

On the XY plane, the photoelectric conversion element 5 is formed in, for example, a rectangular shape having length m=20 μm in the Y direction and length n=3.2 μm in the X direction. The step sections 4 are formed in, for example, a shape close to a rectangle or a shape close to an ellipse having length p=2.0 μm in the Y direction and length q=1.0 μm in the X direction. In the entire solid-state imaging device 10, the step sections 4 are formed in a dot shape of, for example, 4800 dpi. The sizes, the modes of arrangement, and the shapes of the photoelectric conversion element 5 and the step sections 4 explained above are examples only and can also be changed as appropriate. For example, the step sections 4 can also be formed in a smaller size as long as the step sections 4 can be formed in a desired shape.

A part of light made incident on the irradiation surface of the photoelectric conversion element 5 is reflected on the irradiation surface and made incident on an interface between the protective layer 6 and the air layer. If the step sections 4 are not provided in the protective layer 6 and the surface of the protective layer 6 is formed as a flat surface, most of the light reflected on the interface of the protective layer 6 travels in the direction of the photoelectric conversion element 5 again. As there are more light components made incident on the irradiation surface of the photoelectric conversion element 5 from the protective layer 6, interference of light due to multipath reflection in the protective layer 6 more easily occurs.

Figure 2:
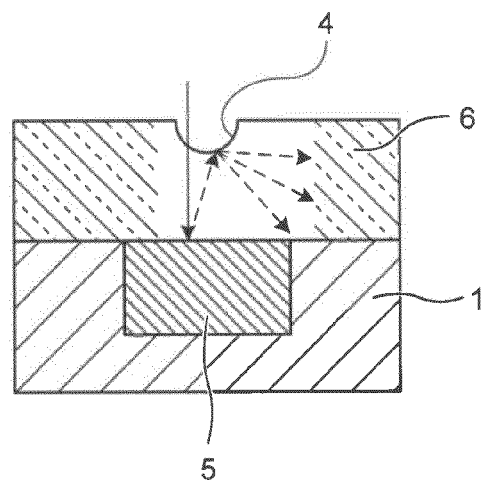
FIG. 2 is a diagram for explaining improvement of a spectral characteristic by provision of step sections.

FIG. 2 is a diagram for explaining improvement of a spectral characteristic by provision of the step sections 4. The light reflected on the irradiation surface of the photoelectric conversion element 5 is dispersed by the reflection on the step sections 4. The light reflected on the interface of the protective layer 6 is dispersed and the light traveling in the direction of the photoelectric conversion element 5 again is reduced, whereby the multipath reflection in the protective layer 6 is suppressed and the interference of the light is reduced. To effectively disperse the light through the reflection on the step sections 4, the step sections 4 are desirably arranged in the light receiving area 3 at a certain degree of a space, for example, a space equal to or larger than the length p in the Y direction of the step section 4.

Figure 3:
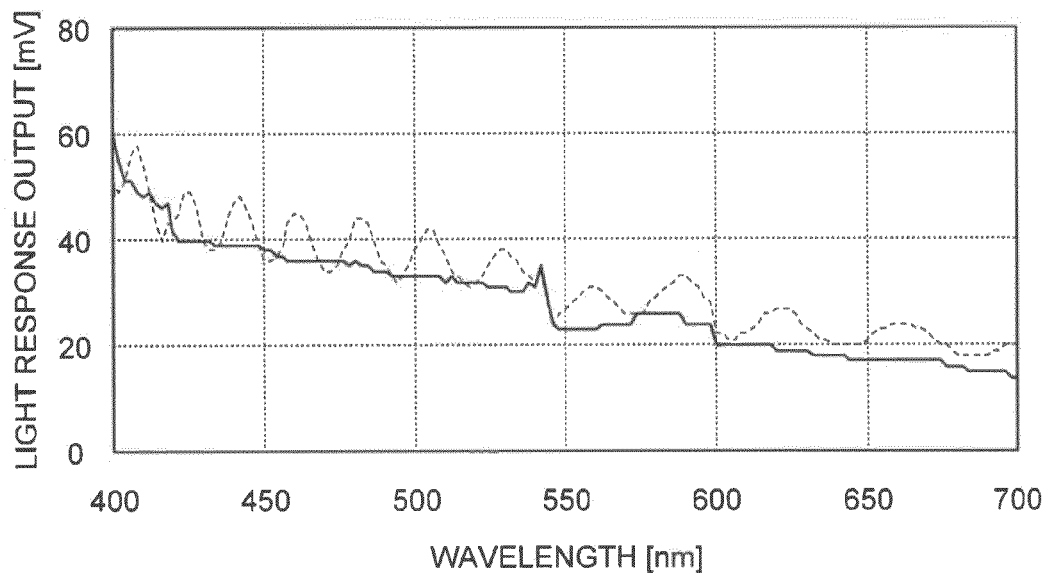
FIG. 3 is a graph of a relation between wavelength of light made incident on a photoelectric conversion element and a light response output of the photoelectric conversion element.

FIG. 3 is a graph of a relation between wavelength of light made incident on the photoelectric conversion element 5 and a light response output of the photoelectric conversion element 5. In the graph, a curve indicated by a broken line represents a spectral characteristic of a comparative example of this embodiment in which interference of light due to the multipath reflection in the protective layer 6 occurs. A curve indicated by a solid line represents a spectral characteristic in the case of this embodiment. In the case of the comparative example, an interference waveform in which the light response output fluctuates in a wavy manner with respect to a change in the wavelength is observed. On the other hand, in the case of this embodiment, the interference waveform is substantially reduced and the spectral characteristic is improved in most of a wavelength region of visible light from 400 nanometers to 700 nanometers.

In this embodiment, in the light receiving area 3, the step sections 4 are formed closer to the center position than the boundary between the light receiving area 3 and the aluminum wire 2 to suppress exposure of the aluminum wire 2 in the step sections 4. Because the exposure of the aluminum wire 2 from the protective layer 6 to the outside is suppressed, it is possible to reduce corrosion, abrasion, and the like of the aluminum wire 2 and maintain reliability of the solid-state imaging device 10. Consequently, the solid-state imaging device 10 can be configured to obtain a satisfactory spectral characteristic and have high reliability. The number of the step sections 4 arranged in the light receiving area 3 is not limited to two. The number of the step sections 4 can also be one or three or more according to the size of the step sections 4, the size of the light receiving area 3, and the like.

Figure 4A:
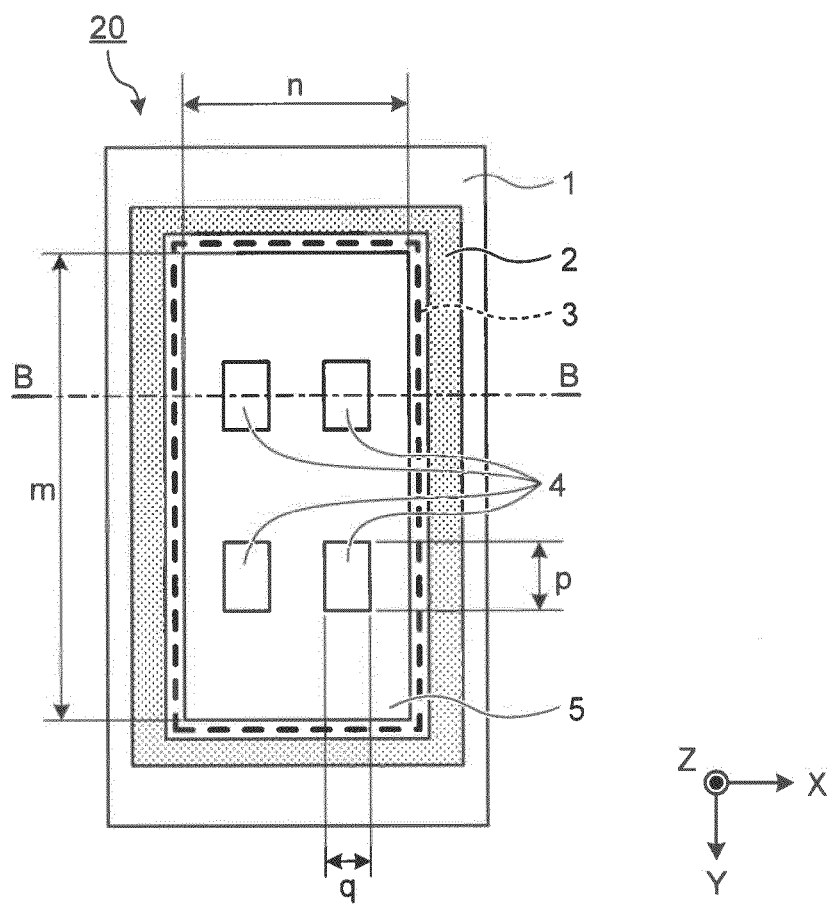
FIGS. 4A and 4B are schematic diagrams of the configuration of a solid-state imaging device according to a second embodiment.
Figure 4B:
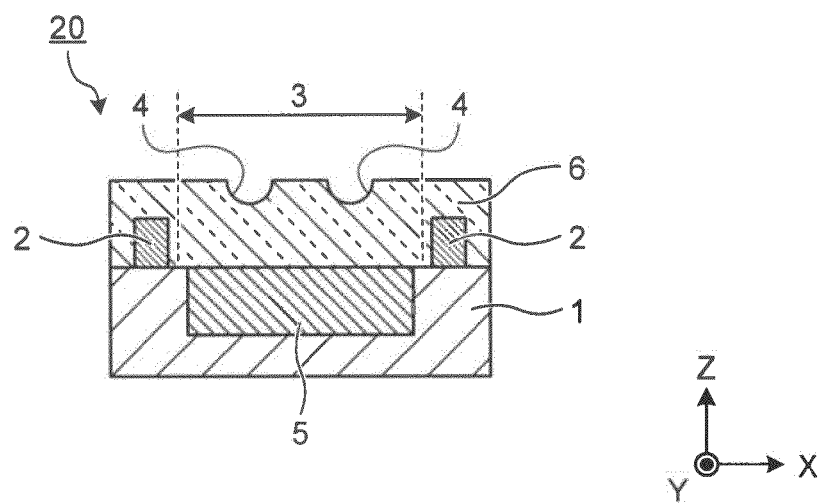

FIGS. 4A and 4B are schematic diagrams of the configuration of a solid-state imaging device 20 according to a second embodiment. FIG. 4A is a diagram of a plane configuration of one photoelectric conversion element 5 and a section around the photoelectric conversion element 5 in the solid-state imaging device 20. FIG. 4B is a diagram of a sectional configuration taken along line B-B shown in FIG. 4A. In the solid-state imaging device 20 according to this embodiment, the step sections 4 are arranged in the X direction and the Y direction in one light receiving area 3. Components same as those in the first embodiment are denoted by the same reference numerals and signs and redundant explanation of the components is omitted.

Two step sections 4 in the X direction and two step sections 4 in the Y direction are provided in a matrix shape in one light receiving area 3. The four step sections 4 are arranged spaced apart from one another to be substantially symmetrical to one another with respect to the center position of the light receiving area 3. In the light receiving area 3, all the step sections 4 are arranged further on the center position side than the boundary between the light receiving area 3 and the aluminum wire 2.

On the XY plane, the photoelectric conversion element 5 is formed in, for example, a rectangular shape having length m=20 μm in the Y direction and length n=8.0 μm in the X direction. The step sections 4 are formed in, for example, a shape close to a rectangle having length p=2.0 μm in the Y direction and length q=1.0 μm in the X direction. In the entire solid-state imaging device 20, the step sections 4 are formed in a dot shape of, for example, 2400 dpi. The sizes, the modes of arrangement, and the shapes of the photoelectric conversion element 5 and the step sections 4 explained above are examples only and can also be changed as appropriate.

To effectively disperse the light through the reflection on the step sections 4, the step sections 4 are desirably arranged in the light receiving area 3 at certain degrees of spaces, for example, a space equal to or larger than the length p in the Y direction and equal to or larger than the length q in the X direction. In the case of the solid-state imaging device 20 according to this embodiment, as in the case of the solid-state imaging device 20 according to the first embodiment, the solid-state imaging device 20 can be configured to obtain a satisfactory spectral characteristic and have high reliability. The number of the step sections 4 arranged in the X direction and the Y direction in the light receiving area 3 can also be changed as appropriate according to the size of the step sections 4, the size of the light receiving area 3, and the like.

Figure 5A:
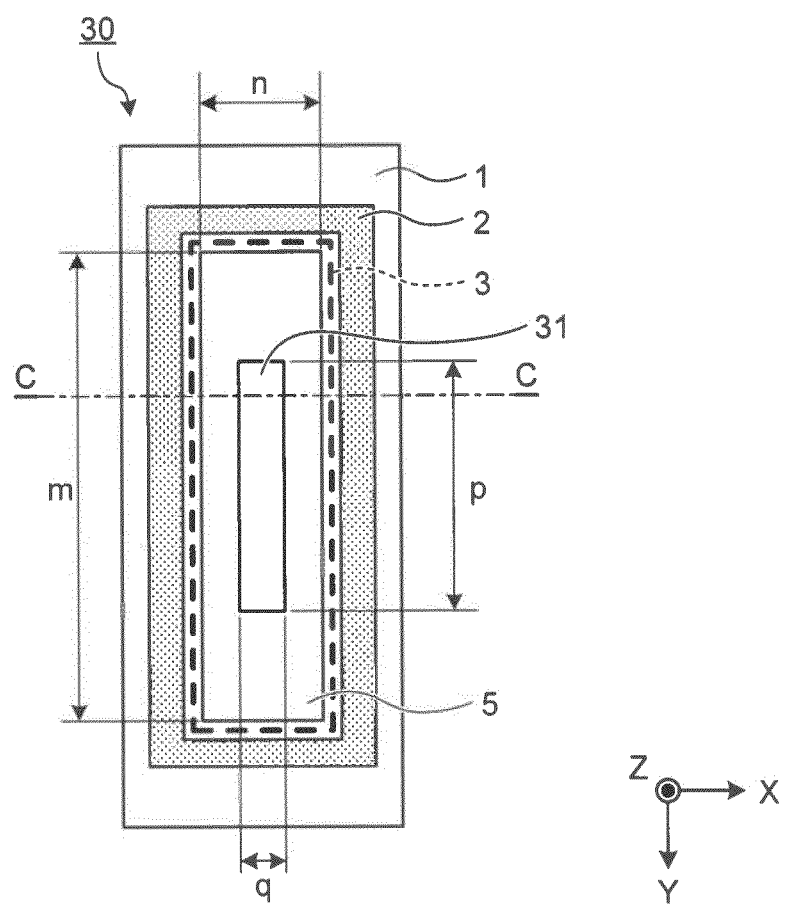
FIGS. 5A and 5B are schematic diagrams of the configuration of a solid-state imaging device according to a third embodiment.
Figure 5B:
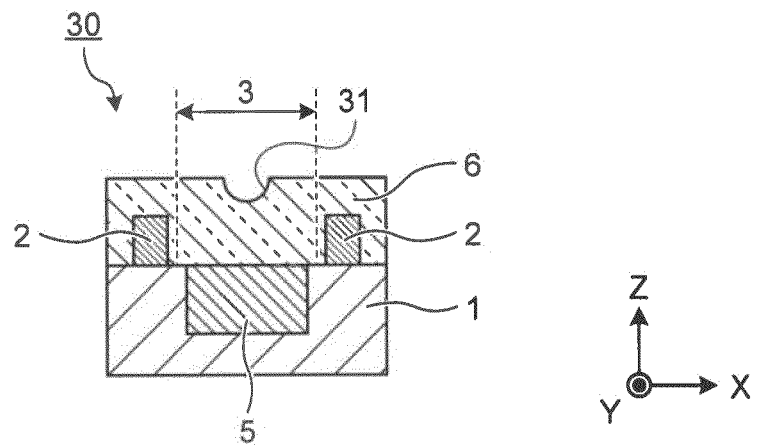

FIGS. 5A and 5B are schematic diagrams of the configuration of a solid-state imaging device 30 according to a third embodiment. FIG. 5A is a diagram of a plane configuration of one photoelectric conversion element 5 and a section around the photoelectric conversion element 5 in the solid-state imaging device 30. FIG. 5B is a diagram of a sectional configuration taken along line C-C shown in FIG. 5A. The solid-state imaging device 30 according to this embodiment includes a step section 31 having a plane shape formed by extending the step sections 4 formed in the dot shape in the first and second embodiment in the Y direction, which is the longitudinal direction of the light receiving area 3. Components same as those in the first embodiment are denoted by the same reference numerals and signs and redundant explanation of the components is omitted.

The step section 31 is formed in a concave shape having a difference in height in the Z direction and includes a curved surface having a curvature in the X direction. The step section 31 has an XZ sectional shape same as that of the step sections 4 in the first and second embodiments. In the Y direction as the longitudinal direction, the bottom of the step section 31 is formed substantially flat except that both ends are formed as curved surfaces. In the plane configuration shown in FIG. 5A, the center of the step section 31 coincides with the center position of the light receiving area 3.

On the XY plane, the photoelectric conversion element 5 is formed in, for example, a rectangular shape having length m=20 μm in the Y direction and length n=3.2 μm in the X direction. The step section 31 is formed in, for example, a shape close to a rectangle or a shape close to an ellipse having length p=10 μm in the Y direction and length q=1.0 μm in the X direction. The sizes, the modes of arrangement, and the shapes of the photoelectric conversion element 5 and the step section 31 explained above are examples only and can also be changed as appropriate.

In the case of the solid-state imaging device 30 according to this embodiment, as in the case of the solid-state imaging device 20, the solid-state imaging device 30 can also be configured to obtain a satisfactory spectral characteristic and have high reliability. One step section 31 is not always provided for one light receiving area 3. A plurality of the step sections 31 can also be provided. For example, in one light receiving area 3, the step sections 31 having the Y direction as a longitudinal direction can also be provided to be arranged in the X direction. The number of the step sections 31 arranged in the light receiving area 3 can also be changed as appropriate according to the size of the step sections 31, the size of the light receiving area 3, and the like.

Figure 6A:
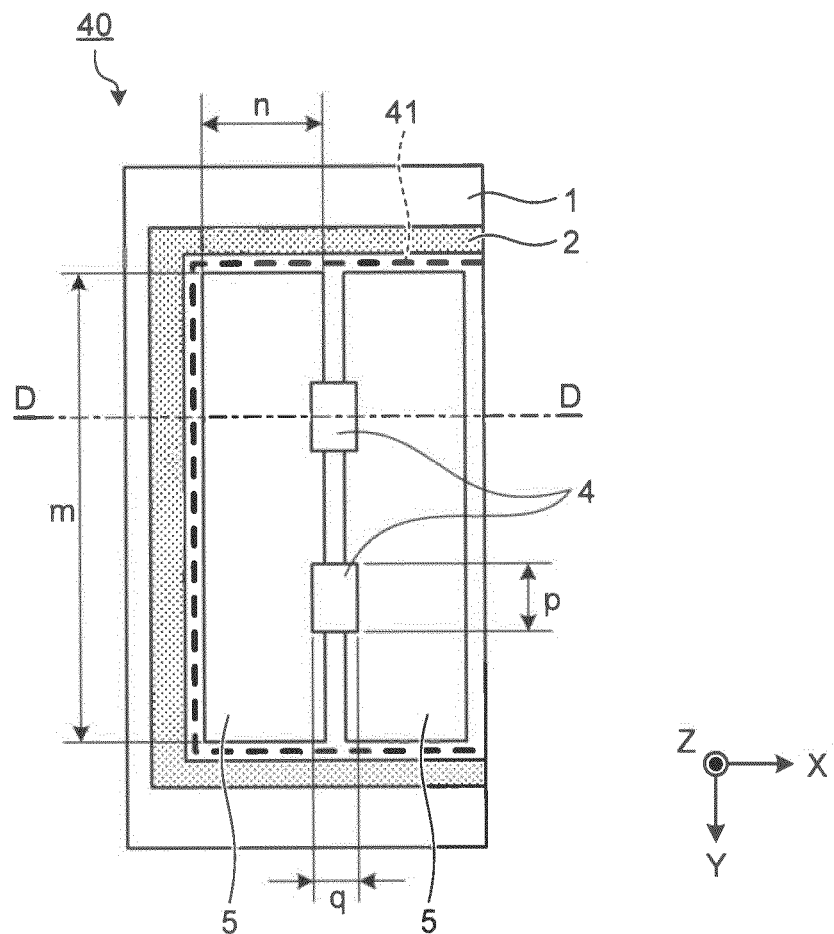
FIGS. 6A and 6B are schematic diagrams of the configuration of a solid-state imaging device according to a fourth embodiment.
Figure 6B:
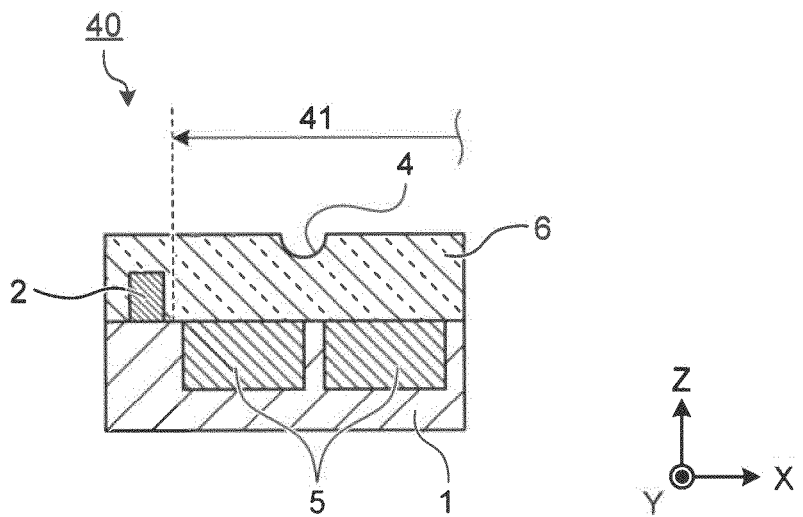

FIGS. 6A and 6B are schematic diagrams of the configuration of a solid-state imaging device 40 according to a fourth embodiment. FIG. 6A is a diagram of a plane configuration of two photoelectric conversion elements 5 and a section around the photoelectric conversion elements 5 in the solid-state imaging device 40. FIG. 6B is a diagram of a sectional configuration taken along line D-D shown in FIG. 6A. In the solid-state imaging device 40 according to this embodiment, the step sections 4 are provided to extend over the two photoelectric conversion elements 5. Components same as those in the first embodiment are denoted by the same reference numerals and signs and redundant explanation of the components is omitted.

In the solid-state imaging device 40 according to this embodiment, a plurality of the photoelectric conversion elements 5 are provided in a light receiving area 41. One light receiving area 41 includes irradiation surfaces of the photoelectric conversion elements 5. In the plane configuration shown in FIG. 6A, the photoelectric conversion elements 5 are formed in a rectangular shape having the Y direction as a longitudinal direction. In the light receiving area 41, the photoelectric conversion elements 5 are arranged in parallel in the X direction, which is a specific direction, spaced apart from each other.

The aluminum wire 2 is formed around the photoelectric conversion elements 5. In both FIGS. 6A and 6B, only a part in which the two photoelectric conversion elements 5 are provided and a section around the photoelectric conversion elements 5 in the light receiving area 41 are shown. In the solid-state imaging device 40, the entire light receiving area 41 forms one pixel. Besides, an irradiation surface area of one photoelectric conversion element 5 or a plurality of the photoelectric conversion elements 5 in the light receiving area 41 can also form one pixel.

In the plane configuration shown in FIG. 6A, the two step sections 4 are formed for the two photoelectric conversion elements 5 adjacent to each other. The two step sections 4 are arranged in the Y direction spaced apart from each other. In the X direction, the step sections 4 are located around a space section between the two photoelectric conversion elements 5. In the Y direction, the step sections 4 are located between the ends and the center of the light receiving area 41.

On the XY plane, the photoelectric conversion element 5 is formed in, for example, a rectangular shape having length m=20 μm in the Y direction and length n=3.2 μm in the X direction. The step sections 4 are formed in, for example, a shape close to a rectangle or a shape close to an ellipse having length p=2.0 μm in the Y direction and length q=1.0 μm in the X direction. A space between the photoelectric conversion elements 5 in the X direction is set to be equal to or smaller the length q in the X direction of the step sections 4.

The step sections 4 are formed such that parts on the left and right are respectively located on the photoelectric conversion elements 5 in the plane configuration shown in FIG. 6A. In this way, the step sections 4 are arranged to extend over the two photoelectric conversion elements 5 in the X direction. The sizes, the modes of arrangement, and the shapes of the photoelectric conversion elements 5 and the step sections 4 explained above are examples only and can also be changed as appropriate. For example, the step sections 4 can also be increased in width in the X direction to secure the sections located on the photoelectric conversion elements 5 wider.

Figure 7:
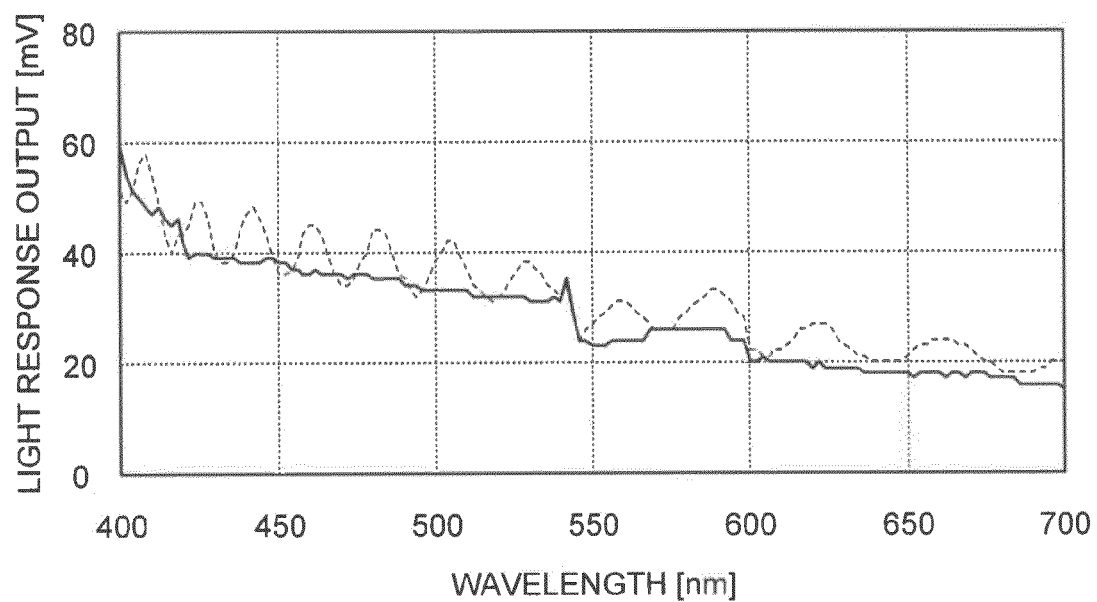
FIG. 7 is a graph of a relation between wavelength of light made incident on a photoelectric conversion element and a light response output of the photoelectric conversion element.

FIG. 7 is a graph of a relation between wavelength of light made incident on the photoelectric conversion element 5 and a light response output of the photoelectric conversion element 5. In the graph, a curve indicated by a broken line represents a spectral characteristic of a comparative example of this embodiment in which interference of light due to the multipath reflection in the protective layer 6 occurs. A curve indicated by a solid line represents a spectral characteristic in the case of this embodiment. In the case of this embodiment, as in the first embodiment, the interference waveform is substantially reduced and the spectral characteristic is improved.

In the case of the solid-state imaging device 40 according to this embodiment, as in the case of the solid-state imaging devices 20 and 30, the solid-state imaging device 40 can be configured to obtain a satisfactory spectral characteristic and have high reliability. The number of the step sections 4 arranged on the two photoelectric conversion elements 5 is not limited to two. The number of the step sections 4 can also be one or three or more according to the size of the step sections 4, the size of the light receiving area 41, and the like.

Figure 8A:
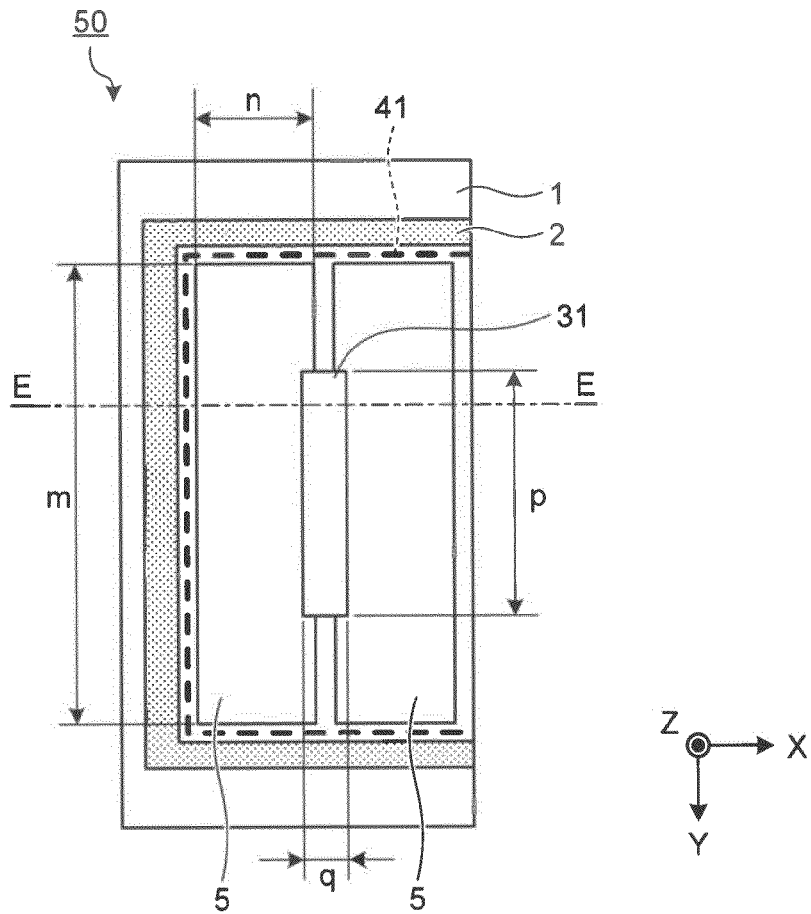
FIGS. 8A and 8B are schematic diagrams of the configuration of a solid-state imaging device according to a fifth embodiment.
Figure 8B:
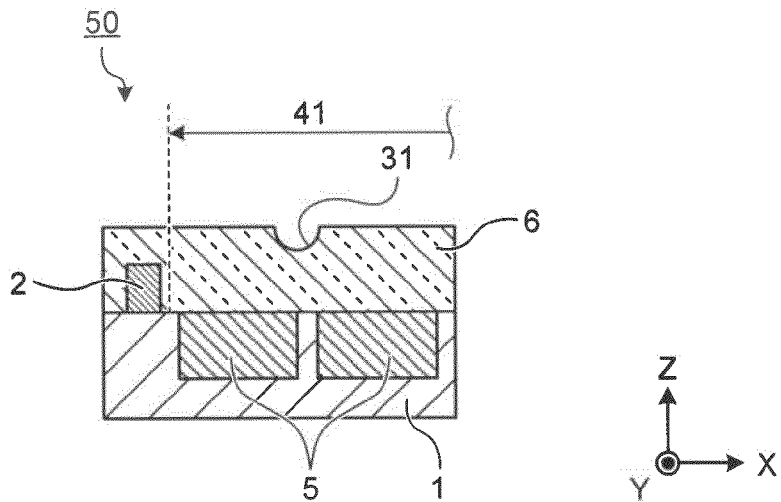

FIGS. 8A and 8B are schematic diagrams of the configuration of a solid-state imaging device 50 according to a fifth embodiment. FIG. 8A is a diagram of a plane configuration of two photoelectric conversion elements 5 and a section around the photoelectric conversion elements 5 in the solid-state imaging device 50. FIG. 8B is a diagram of a sectional configuration taken along line E-E shown in FIG. 8A. In the solid-state imaging device 50 according to this embodiment, the step section 31 same as that in the third embodiment is provided to extend over the two photoelectric conversion elements 5. Components same as those in the first to fourth embodiments are denoted by the same reference numerals and signs and redundant explanation of the components is omitted.

In the plane configuration shown in FIG. 8A, one step section 31 is formed for the two photoelectric conversion elements 5. In the X direction, the step section 31 is located with a space section between the two photoelectric conversion elements 5 as the center. In the Y direction, the center of the step section 31 coincides with the center position of the light receiving area 41.

On the XY plane, the photoelectric conversion element 5 is formed in, for example, a rectangular shape having length m=20 μm in the Y direction and length n=3.2 μm in the X direction. The step section 31 is formed in, for example, a shape close to a rectangle or a shape close to an ellipse having length p=10 μm in the Y direction and length q=1.0 μm in the X direction. In the case of the solid-state imaging device 50 according to this embodiment, as in the case of the solid-state imaging devices 20, 30 and 40, the solid-state imaging device 50 can be configured to obtain a satisfactory spectral characteristic and have high reliability.

The sizes, the modes of arrangement, and the shapes of the photoelectric conversion elements 5 and the step section 31 explained this embodiment are examples only and can also be changed as appropriate. For example, the step section 31 can also be increased in width in the X direction to secure the sections located on the photoelectric conversion elements 5 wider.

Figure 9A:
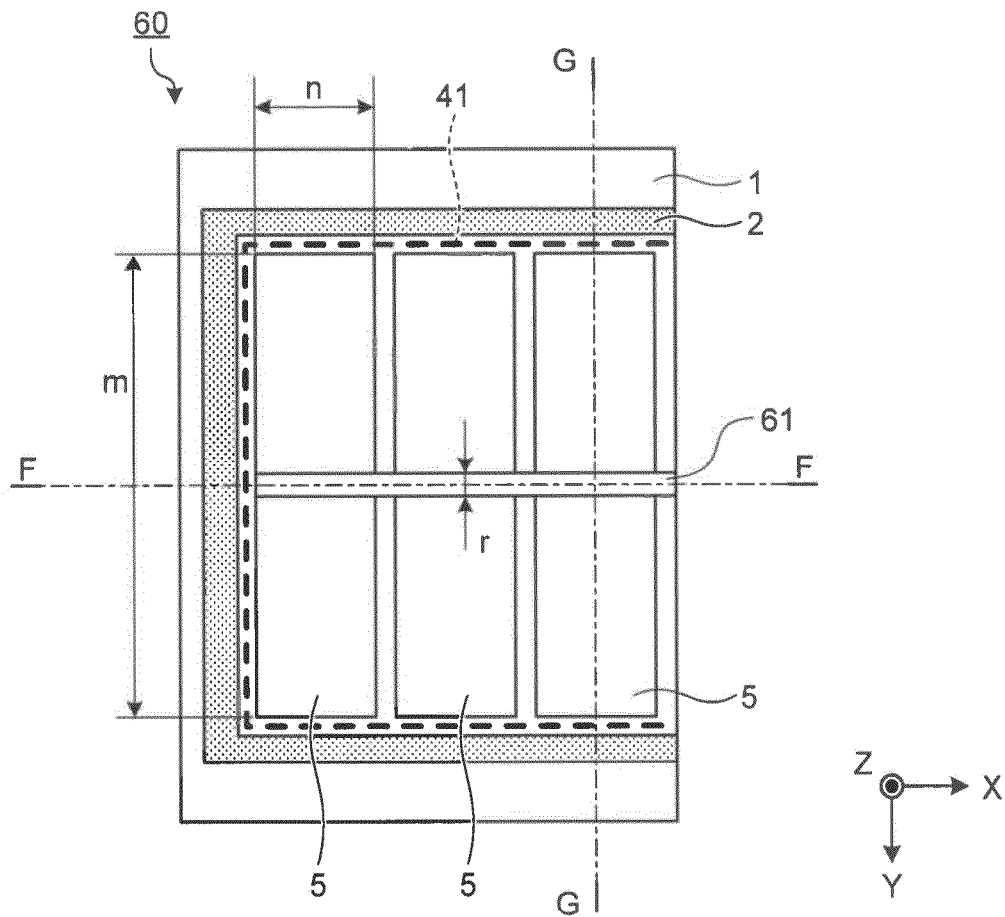
FIGS. 9A and 9B are schematic diagrams of the configuration of a solid-state imaging device according to a sixth embodiment.
Figure 9B:
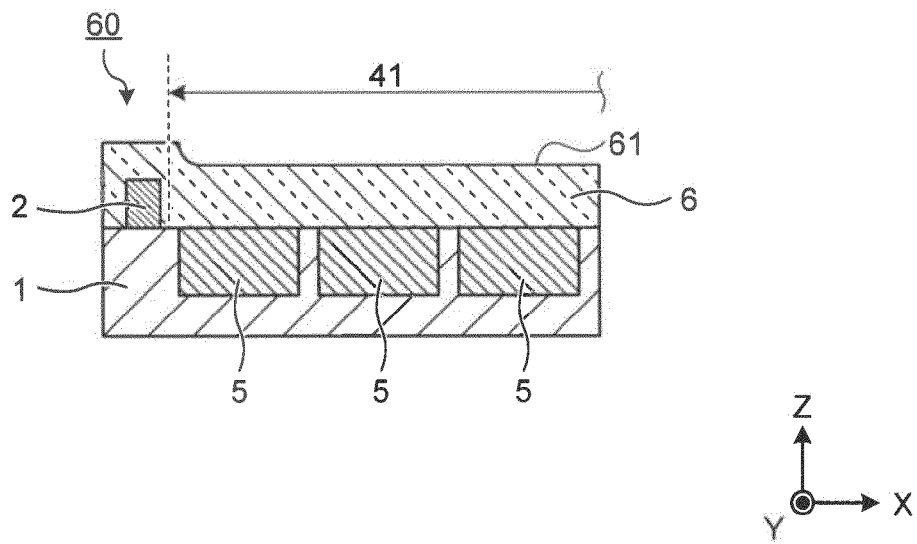
Figure 10:
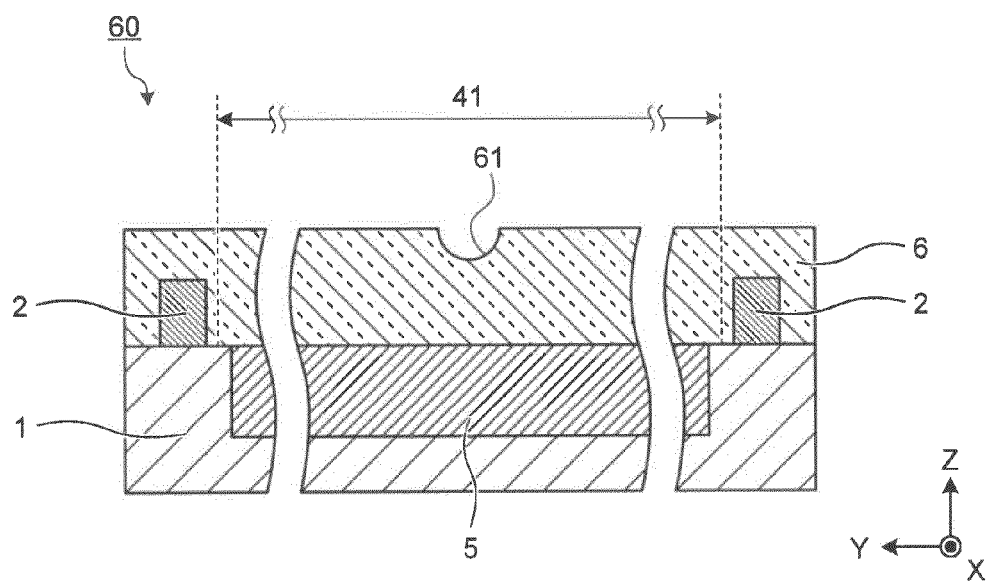
FIG. 10 is a diagram of a sectional configuration taken along line G-G shown in FIG. 9A.

FIGS. 9A and 9B are schematic diagrams of a plane configuration and a sectional configuration of a solid-state imaging device 60 according to a sixth embodiment. FIG. 9A is a diagram of a plane configuration of three photoelectric conversion elements 5 and a section around the photoelectric conversion elements 5 in the solid-state imaging device 60. FIG. 9B is a diagram of a sectional configuration taken along line F-F shown in FIG. 9A. FIG. 10 is a diagram of a sectional configuration taken along line G-G shown in FIG. 9A. The solid-state imaging device 60 according to this embodiment includes a step section 61 formed in a belt shape having the X direction, which is a specific direction, as a longitudinal direction. Components same as those in the first and fourth embodiments are denoted by the same reference numerals and signs and redundant explanation of the components is omitted.

The step section 61 is provided to extend over a plurality of the photoelectric conversion elements 5 arranged in parallel in one light receiving area 41. The step section 61 is located over the entire light receiving area 41 in the X direction and is located in the center of the light receiving area 41 in the Y direction. In both FIGS. 9A and 9B, only a part in which the three photoelectric conversion elements 5 are provided and a section around the photoelectric conversion elements 5 in the light receiving area 41 are shown.

The step section 61 is formed in a concave shape having a difference in height in the Z direction. The step section 61 includes a curved surface having curvature in the Y direction. In the X direction as the longitudinal direction, the bottom of the step section 61 is formed substantially flat except that both ends are formed as curved surfaces. On the XZ section shown in FIG. 9B, one end in the X direction of the step section 61 is represented by a curve and a part of the bottom continuing the end is represented by a straight line. As shown in FIG. 10, a YZ sectional shape of the step section 61 is the same as the XZ sectional shape of the step section 4 in the first embodiment.

On the XY plane, the photoelectric conversion element 5 is formed in, for example, a rectangular shape having length m=20 μm in the Y direction and length n=3.2 μm in the X direction. The step section 61 is formed in, for example, a belt shape having width r=2.0 μm in the Y direction.

Figure 11:
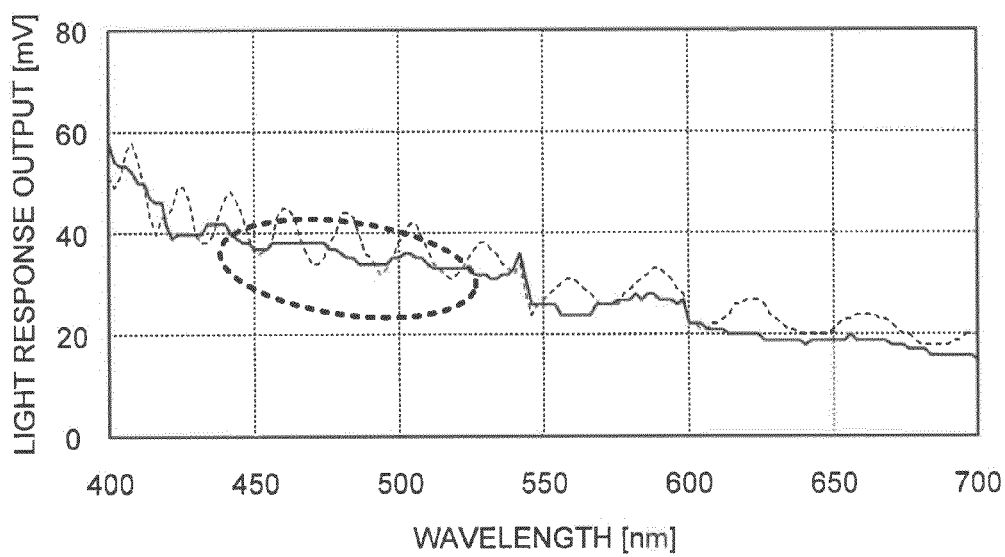
FIG. 11 is a graph of a relation between wavelength of light made incident on a photoelectric conversion element and a light response output of the photoelectric conversion element.

FIG. 11 is a graph of a relation between wavelength of light made incident on the photoelectric conversion element 5 and a light response output of the photoelectric conversion element 5. In the graph, a curve indicated by a broken line represents a spectral characteristic of a comparative example of this embodiment in which interference of light due to the multipath reflection in the protective layer 6 occurs. A curve indicated by a solid line represents a spectral characteristic in the case of this embodiment. In the case of the this embodiment, as in the embodiment explained above, an interference waveform is reduced and the spectral characteristic is improved in most of a wavelength region of visible light from 400 nanometers to 700 nanometers. In the case of the solid-state imaging device 60 according to this embodiment, as in the case of the solid-state imaging devices 20, 30, 40, and 50, the solid-state imaging device 60 can be configured to obtain a satisfactory spectral characteristic and have high reliability.

Figure 12:
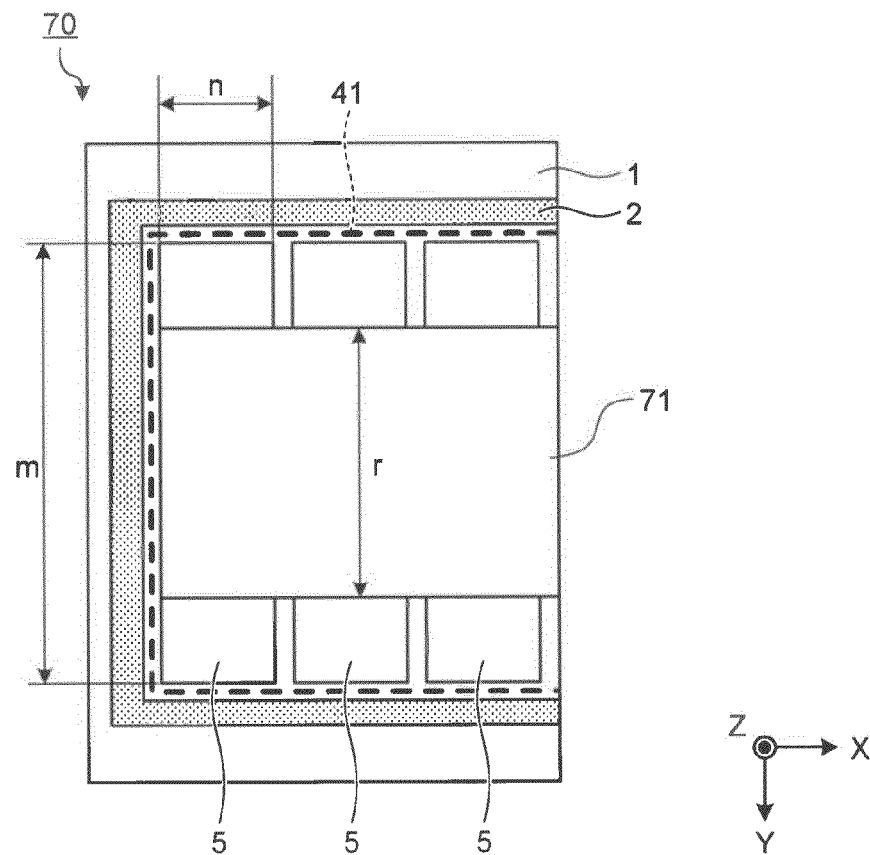
FIG. 12 is a schematic diagram of a plane configuration of a solid-state imaging device according to a comparative example.
Figure 13:
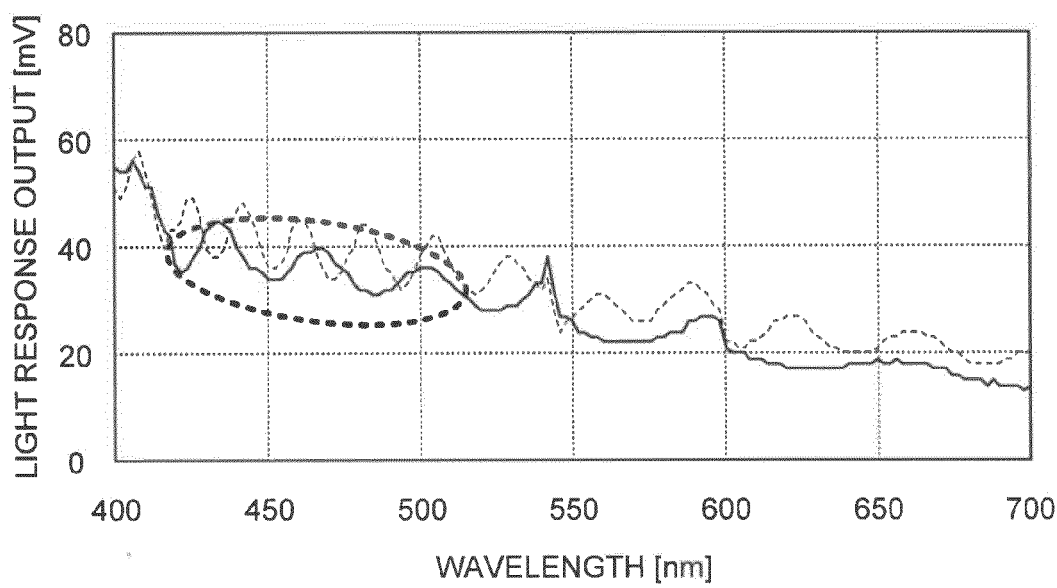
FIG. 13 is a graph of a spectral characteristic in the case of the comparative example shown in FIG. 12.

FIG. 12 is a schematic diagram of a plane configuration of a solid-state imaging device 70 according to a comparative example of this embodiment. FIG. 13 is a graph of a spectral characteristic in the case of the comparative example shown in FIG. 12. The solid-state imaging device 70 according to this comparative example includes a step section 71 formed in a belt shape having width r=10 μm in the Y direction. A spectral characteristic in the case of this comparative example is represented by a curve of a solid line in the graph of FIG. 13.

As indicated by encircling with dotted lines in both the graphs of FIGS. 11 and 13, in particular, in a wavelength region from 450 nanometers to 520 nanometers, the interference waveform is more substantially reduced in this embodiment than in the comparative example. Therefore, it is possible to effectively reduce the interference waveform by reducing the width of the belt shape of the step section and increasing the curvature of the concave shape.

The sizes, the modes of arrangement, and the shapes of the photoelectric conversion element 5 and the step section 61 explained this embodiment are examples only and can also be changed as appropriate. For example, one step section 61 is not always provided for one light receiving area 41. A plurality of the step sections 61 can also be provided. The step section 61 is not always formed over the entire X direction of one light receiving area 41. For example, the step section 61 can also be divided into a plurality of sections and formed in the X direction.

Figure 14:
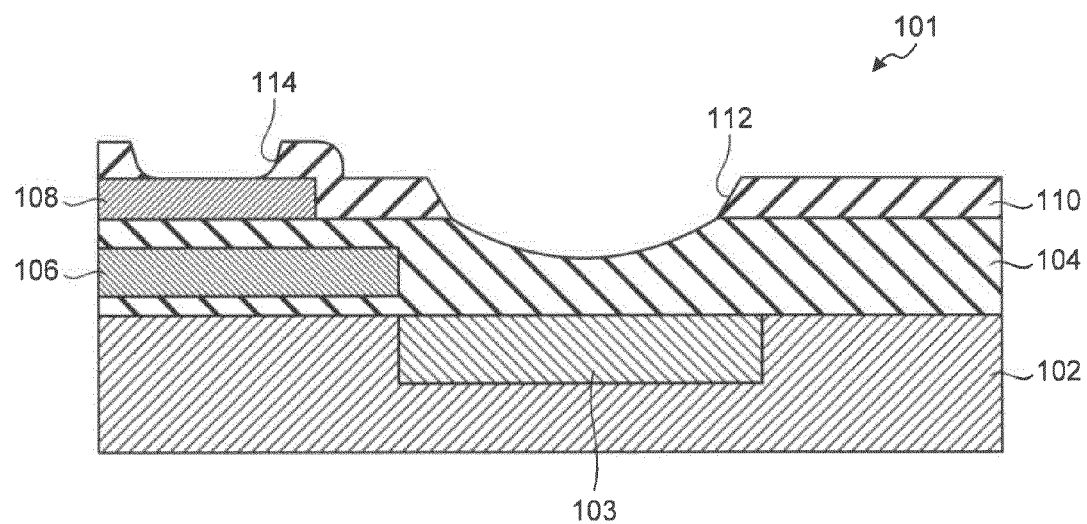
FIG. 14 is a schematic diagram of a sectional configuration of a solid-state imaging device according to a seventh embodiment.

FIG. 14 is a schematic diagram of a sectional configuration of a solid-state imaging device according to a seventh embodiment. A solid-state imaging device 101 includes a silicon substrate 102, a photoelectric conversion element 103, an interlayer insulating film 104, a wire (a first layer wire) 106, a pad electrode (a second layer wire) 108, and a surface protective film 110. The interlayer insulating film 104 and the surface protective film 110 are included in a protective layer.

The photoelectric conversion element 103 that converts light from a subject into signal charges is formed on the surface of the silicon substrate 102, which is a semiconductor substrate. The surface of the silicon substrate 102, on which the photoelectric conversion element 103 is formed, is covered with a silicon oxide ($SiO_2$) film functioning as the interlayer insulating film 104. The wire 106 is disposed in a layer of the interlayer insulating film 104. The pad electrode 108 is disposed on the surface of the interlayer insulating film 104. For example, aluminum is used for the wire 106 and the pad electrode 108. The wire 106 can also be a wire functioning as a light blocking section that blocks light.

The surfaces of the interlayer insulating film 104 and the pad electrode 108 are covered with the surface protective film 110. For example, a silicon oxide film or a silicon nitride film ($Si_3N_4$) is used for the surface protective film 110. A first concave section 112 and a second concave section 114 are formed in the surface protective film 110. The first concave section 112 is formed to suppress interference of light. The first concave section 112 as a step section is formed in a position opposed to the photoelectric conversion element 103 formed on the silicon substrate 102. Consequently, the first concave section 112 is formed in an area through which light made incident on the photoelectric conversion element 103 is transmitted. The first concave section 112 is formed from the interlayer insulating film 104 to the surface protective film 110 to pierce through the surface protective film 110 and cut out a part of the interlayer insulating film 104. The first concave section 112 is formed in a shape having a curvature at least in one direction.

The second concave section 114 is formed to pierce through the surface protective film 110. The second concave section 114 is formed in a position opposed to the pad electrode 108. The second concave section 114 is formed to pierce through the surface protective film 110. The pad electrode 108 is exposed from the second concave section 114.

A manufacturing process for the solid-state imaging device 101 is explained. FIGS. 15 to 19 are diagrams for explaining the manufacturing process for the solid-state imaging device 101. FIG. 20 is a flowchart for explaining the manufacturing process for the solid-state imaging device 101.

Figure 15:
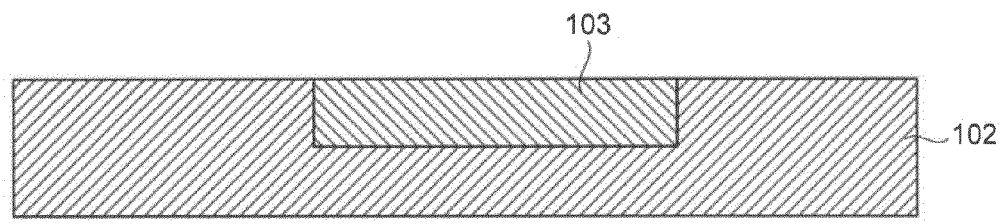
FIGS. 15 to 19 are diagrams for explaining a manufacturing process for the solid-state imaging device.
Figure 16:
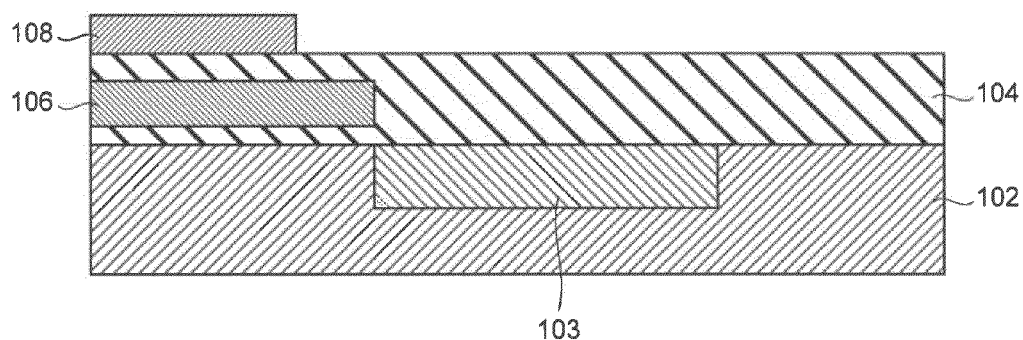

First, as shown in FIG. 15, the photoelectric conversion element 103 as an impurity layer is formed on the surface of the silicon substrate 102 (step S1). Subsequently, as shown in FIG. 16, the surface of the silicon substrate 102 is covered with the interlayer insulating film 104, the wire 106 is disposed in the inside of the interlayer insulating film 104, and the pad electrode 108 is disposed on the surface of the interlayer insulating film 104 (step S2). The wire 106 has, besides a function of a normal wire, a function of a light blocking section that blocks light.

Figure 17:
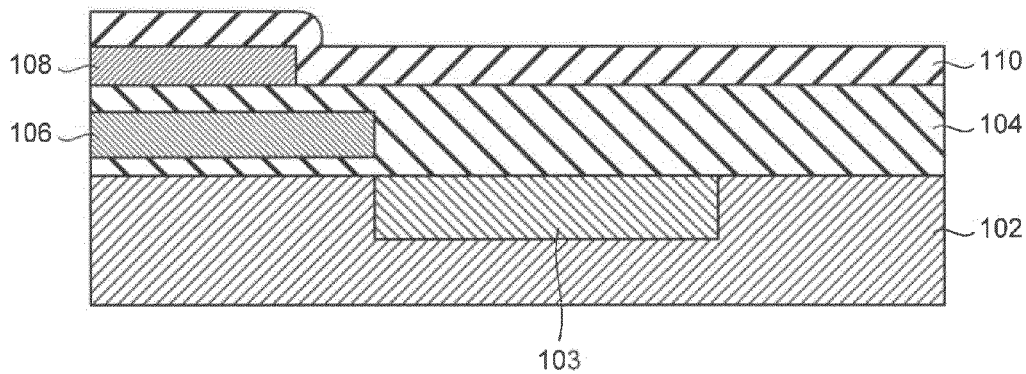
Figure 18:
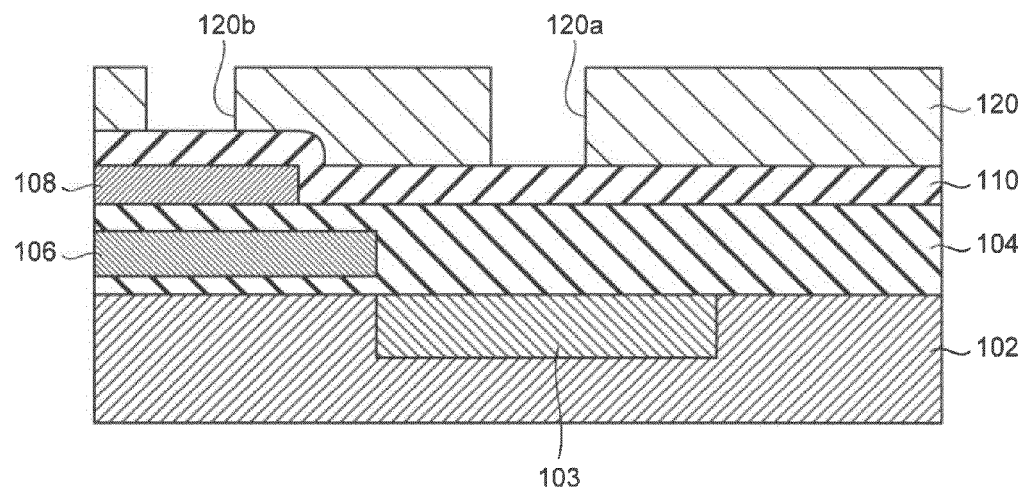

As shown in FIG. 17, the surfaces of the interlayer insulating film 104 and the pad electrode 108 are covered with the surface protective film 110 (step S3). As shown in FIG. 18, a resist 120 is applied to the surface of the surface protective film 110 (step S4). The resist 120 is patterned to have a first opening 120a and a second opening 120b.

The first opening 120a is formed in a position opposed to the photoelectric conversion element 103 and is provided to form the first concave section 112 in the solid-state imaging device 101 in the next step. The second opening 120b is formed in a position opposed to the pad electrode 108 and is provided to form the second concave section 114 in the solid-state imaging device 101 in the next step.

Figure 19:
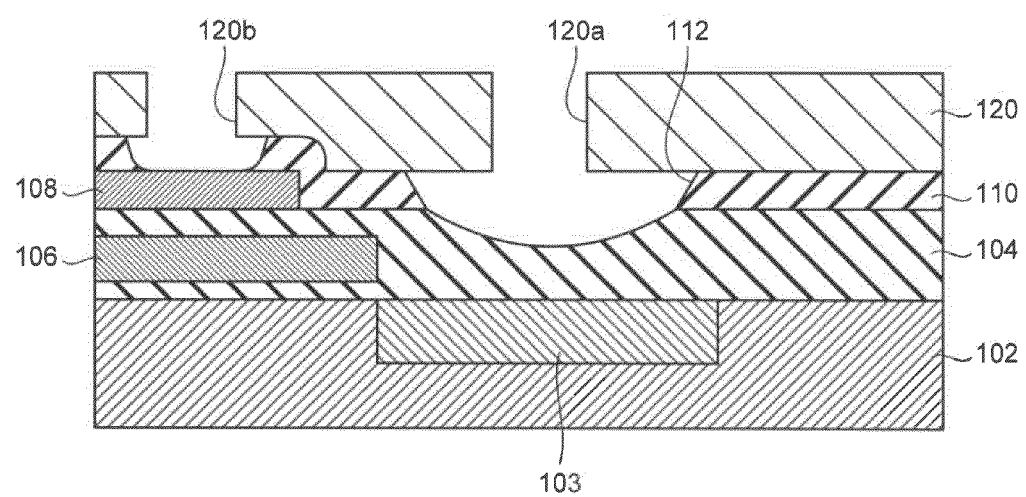

As shown in FIG. 19, isotropic etching is performed through the first opening 120a and the second opening 120b formed in the resist 120 to etch the surface protective film 110 (step S5). The surface protective film 110 is pierced through and the interlayer insulating film 104 is also etched by the isotropic etching performed through the first opening 120a. Consequently, the first concave section 112 is formed extending over the surface protective film 110 and the interlayer insulating film 104.

Because the surface protective film 110 is formed at substantially uniform thickness, if the surface protective film 110 is pierced through and the interlayer insulating film 104 is also etched by the isotropic etching performed through the first opening 120a as explained above, the surface protective film 110 is surely pierced through on the second opening 120b side as well. It is possible to more surely expose the pad electrode 108. Consequently, it is possible to suppress an exposure failure of the pad electrode 108 and realize improvement of yield. Because the pad electrode 108 is exposed, it is possible to extract signal charges via the pad electrode 108. The resist 120 is peeled off (step S6). Consequently, the solid-state imaging device 101 including the first concave section 112 and the second concave section 114 shown in FIG. 14 can be obtained.

As explained above, the isotropic etching is performed after the surfaces of the interlayer insulating film 104 and the pad electrode 108 are covered with the surface protective film 110. Therefore, it is possible to perform, in one step, the step of exposing the pad electrode 108 and the step of forming a step shape (the first concave section 112) on a light incidence surface of the solid-state imaging device 101. Consequently, it is possible to obtain a method of manufacturing, while suppressing the number of manufacturing steps, the solid-state imaging device 101 including the step shape that suppresses interference of light. The manufacturing method according to this embodiment can also be applied to manufacturing of the solid-state imaging devices according to the first to sixth embodiments.

FIG. 21 is a block diagram of a schematic configuration of a CCD image sensor 121 as an example of a solid-state imaging device. The CCD image sensor 121 includes a CCD or the like as charge transfer means and includes a plurality of the photoelectric conversion elements 103. The photoelectric conversion elements 103 convert light into signal charges. A CCD 122 reads out the converted signal charges from the photoelectric conversion elements 103 and transfers the converted signal charges to an amplifying unit 124. The amplifying unit 124 converts the transferred signal charges into signal voltage and sends the signal voltage to an output circuit 126. The output circuit 126 outputs the received signal voltage to a predetermined output destination. Although not shown in FIG. 21, the CCD image sensor 121 also includes a silicon substrate, an interlayer insulating film, a wire, a pad electrode, and a surface protective film. In manufacturing of such a CCD image sensor 121, as in the manufacturing of the solid-state imaging device, it is possible to suppress interference of light and obtain an image having high reproducibility by using the manufacturing process explained in the seventh embodiment. It is also possible to suppress the number of manufacturing steps for the CCD image sensor 121 and hold down manufacturing cost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
    a photoelectric conversion element provided in a light receiving area of a semiconductor substrate and configured to generate charges corresponding to an incident light amount;
    a light blocking section formed around the light receiving area and configured to block light; and
    a protective layer provided on the semiconductor substrate and configured to protect the photoelectric conversion element and the light blocking section, wherein
    a step section having a difference in height in a direction perpendicular to an irradiation surface of the photoelectric conversion element is formed on a surface of the protective layer on an opposite side of the semiconductor substrate side,
    the step section is provided in the light receiving area,
    at least a singularity of the step section is provided for each the photoelectric conversion element, and
    a plurality of the step sections are provided for each the photoelectric conversion element.

2. The solid-state imaging device according to claim 1, wherein the step sections are arranged in parallel in at least one of a first direction and a second direction perpendicular to the first direction in a singularity of the light receiving area.

3. The solid-state imaging device according to claim 2, wherein the step sections provided in the one light receiving area are arranged substantially symmetrical to each other with respect to a center position of the light receiving area.

4. The solid-state imaging device according to claim 1, wherein the step section is formed in a shape having a curvature in at least one of a first direction and a second direction perpendicular to the first direction.

5. The solid-state imaging device according to claim 1, wherein the step section is arranged further on a center position side of the light receiving area than a boundary between the light receiving area and the blocking section.

6. The solid-state imaging device according to claim 1, wherein a plurality of the step sections are arranged at a space equal to or larger than length of the step section in at least one of a first direction and a second direction perpendicular to the first direction.

7. The solid-state imaging device according to claim 1, wherein a singularity of the light receiving area includes the irradiation surface of a singularity of the photoelectric conversion element.

8. A solid-state imaging device comprising:
    a photoelectric conversion element provided in a light receiving area of a semiconductor substrate and configured to generate charges corresponding to an incident light amount;
    a light blocking section formed around the light receiving area and configured to block light; and
    a protective layer provided on the semiconductor substrate and configured to protect the photoelectric conversion element and the light blocking section, wherein
    a step section having a difference in height in a direction perpendicular to an irradiation surface of the photoelectric conversion element is formed on a surface of the protective layer on an opposite side of the semiconductor substrate side,
    the step section is provided in the light receiving area, and
    the step section is provided to extend over at least a pair of the photoelectric conversion elements.

9. The solid-state imaging device according to claim 8, wherein the step sections are provided to extend over the two photoelectric conversion elements adjacent to each other.

10. The solid-state imaging device according to claim 8, wherein
    a plurality of the photoelectric conversion elements are arranged in parallel in a specific direction in the light receiving area, and
    the step section has a belt shape having the specific direction as a longitudinal direction in a plane parallel to the irradiation surface.

11. The solid-state imaging device according to claim 8, wherein the step section is formed in a shape having a curvature in at least one of a first direction and a second direction perpendicular to the first direction.

12. The solid-state imaging device according to claim 8, wherein the step section is arranged further on a center position side of the light receiving area than a boundary between the light receiving area and the blocking section.

13. The solid-state imaging device according to claim 8, wherein a plurality of the step sections are arranged at a space equal to or larger than length of the step section in at least one of a first direction and a second direction perpendicular to the first direction.

14. The solid-state imaging device according to claim 8, wherein a singularity of the light receiving area includes a plurality of the irradiation surfaces of a plurality of the photoelectric conversion elements.

15. A solid-state imaging device comprising:
- a photoelectric conversion element provided in a light receiving area of a semiconductor substrate and configured to generate charges corresponding to an incident light amount;
- a light blocking section formed around the light receiving area and configured to block light;
- a protective layer provided on the semiconductor substrate and configured to protect the photoelectric conversion element and the light blocking section;
- an interlayer insulating film included in the protective layer;
- a pad electrode formed on the interlayer insulating film;
- a surface protective film configured to cover the interlayer insulative film and the pad electrode and included in the protective layer together with the interlayer insulating film;
- a first concave section as the step section formed from the interlayer insulating film to the surface protective film; and
- a second concave section formed on the surface protective film and configured to expose the pad electrode, wherein
- a step section having a difference in height in a direction perpendicular to an irradiation surface of the photoelectric conversion element is formed on a surface of the protective layer on an opposite side of the semiconductor substrate side, and
- the step section is provided in the light receiving area.

16. The solid-state imaging device according to claim 15, wherein the step section is formed in a shape having a curvature in at least one of a first direction and a second direction perpendicular to the first direction.

17. The solid-state imaging device according to claim 15, wherein the step section is arranged further on a center position side of the light receiving area than a boundary between the light receiving area and the blocking section.

18. The solid-state imaging device according to claim 15, wherein a plurality of the step sections are arranged at a space equal to or larger than length of the step section in at least one of a first direction and a second direction perpendicular to the first direction.

19. The solid-state imaging device according to claim 15, wherein a singularity of the light receiving area includes the irradiation surface of a singularity of the photoelectric conversion element.

20. The solid-state imaging device according to claim 15, wherein a singularity of the light receiving area includes a plurality of the irradiation surfaces of a plurality of the photoelectric conversion elements.

\* \* \* \* \*